United States Patent [19]

Choon et al.

[11] Patent Number: 5,463,531
[45] Date of Patent: Oct. 31, 1995

[54] PCMCIA ELECTRONICS HOUSING

[75] Inventors: Low P. Choon; Brian Redman, both of Richmond, Canada

[73] Assignee: Motorola, Inc., Schaumburg, Ill.

[21] Appl. No.: 270,354

[22] Filed: Jul. 5, 1994

[51] Int. Cl.$^6$ ........................................ H05K 1/14
[52] U.S. Cl. ..................... 361/737; 361/728; 361/752; 361/796; 439/44; 439/928
[58] Field of Search ........................ 361/728, 730, 361/733, 734, 737, 752, 758, 796, 801, 785; 439/44, 60–68, 74, 76, 928; 174/250, 17 R; 235/487, 492

[56] References Cited

U.S. PATENT DOCUMENTS

| | | | |
|---|---|---|---|
| 5,339,222 | 8/1994 | Simmons et al. | 361/818 |
| 5,373,149 | 12/1994 | Rasmussen | 235/492 |
| 5,408,386 | 4/1995 | Ringer et al. | 361/785 |

Primary Examiner—Leo P. Picard
Assistant Examiner—Y. Whang
Attorney, Agent, or Firm—Charles W. Bethards

[57] ABSTRACT

An electronics housing that is compliant with a type II PCMCIA standard includes a frame (101) and coupled thereto a first and a second cover (103, 137), a connector (121) with a body (123) and a plurality of terminals (131), and a carrier (111) with a first side (113) and a second side (115). The first cover (103) includes an interior surface (105) with the carrier (111) disposed adjacent thereto and an interface surface (107). The body (123) is disposed adjacent to the interface surface (107) and includes a plurality of openings (129) extending through the body. The plurality of terminals (131) each includes a receptacle (133) and an integral contact (135) where the receptacle is disposed within the opening and the integral contact extends from the body and is formed to be mechanically coupled to the second side (115).

13 Claims, 2 Drawing Sheets

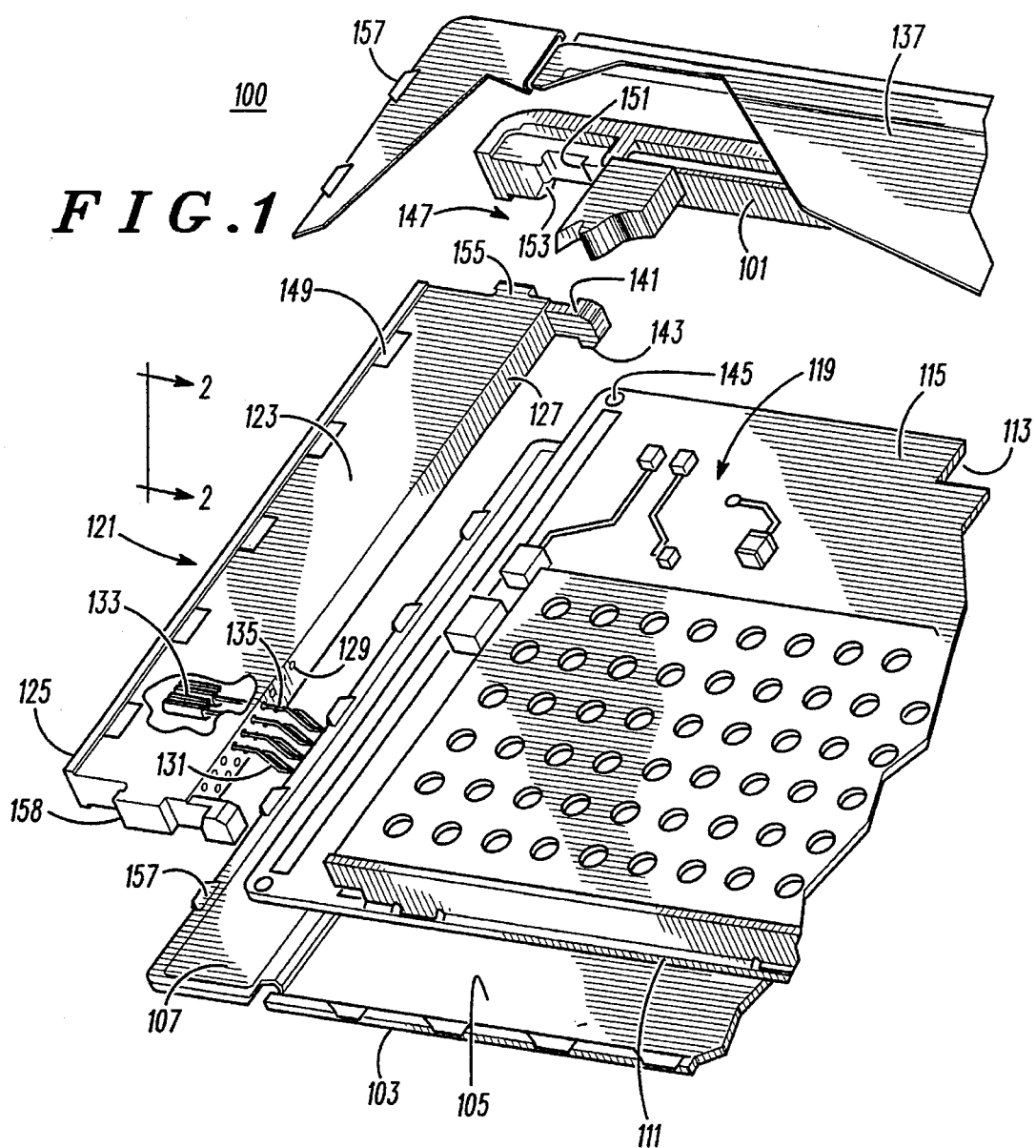
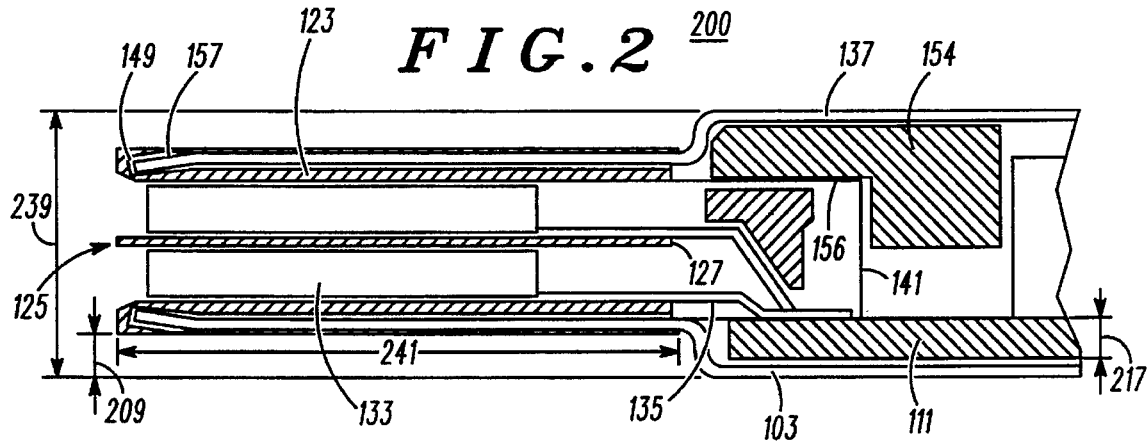

PCMCIA ELECTRONICS HOUSING

FIELD OF THE INVENTION

The instant disclosure deals with electronics housings and more particularly but not limited to such housings that conform to the Personal Computer Manufacturer Card International Association (PCMCIA) standard.

BACKGROUND OF THE INVENTION

The well known PCMCIA standards specify both physical and electrical characteristics for an interface between various peripheral functions and a host computer. The physical characteristics include dimensions that define a small package that has presented a significant challenge to practitioners in the field of designing housings for various peripheral functions, including electronic circuitry. Many approaches to PCMCIA compliant housings have been proposed. All such proposals suffer from one or more deficiencies.

Some proposals depend on mechanical fasteners, such as screws for the physical integrity of the package. These fastener arrangements can take an excessive amount of physical space plus are subject to misuse and are an inherent manufacturing problem given the relatively small size of the fasteners. Other housings depend on adhesive for integrity. This again may be a manufacturing and reliability or quality problem.

Another problem often encountered in a PCMCIA compliant housing or package stems from the prescribed centralized location for a connector that provides the electrical interface. Although this location of the connector lends itself to a housing or package design where a carrier such as a printed circuit board is centrally located within the available volume it creates problems when the carrier must be offset to one side of a housing, such as when vertical space for electronic components must be maximized. These circumstances may arise in the case of a type II PCMCIA compliant package.

Proposals to address this need have included a PCMCIA type connector together with a flexible circuit that is either soldered to the carrier or utilizes a further mating connector pair to accomplish the necessary offsetting of the carrier. Clearly a need exists for a PCMCIA housing that elements the deficiencies in the art while optimizing the manufacturability and volume available for internal components.

BRIEF DESCRIPTION OF THE DRAWINGS

The features of the present invention which are believed to be novel are set forth with particularity in the appended claims. However, the invention together with further advantages thereof, may best be understood by reference to the accompanying drawings in which:

FIG. 1 is an exploded isometric view demonstrating components of a housing in accordance with an embodiment of the instant invention.

FIG. 2 is a detailed cross sectional diagram of a portion of the FIG. 1 embodiment as assembled.

DETAILED DESCRIPTION OF A PREFERRED EMBODIMENT

Figure 3:
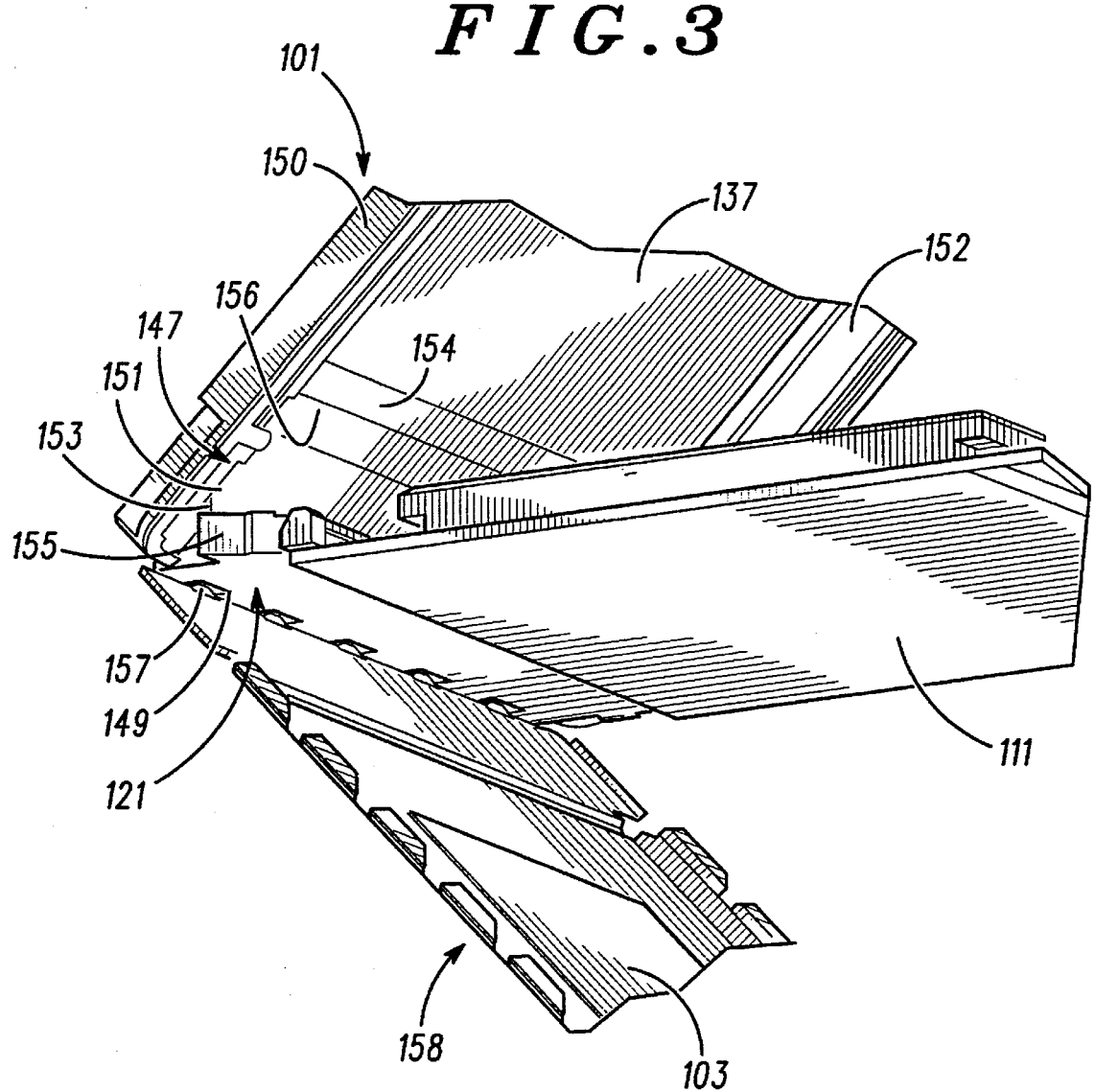
FIG. 3 is an overview of the housing.

Generally the instant disclosure deals with an electronics housing that is compliant with a type II Personal Computer Manufacturer Card International Association (PCMCIA) standard. This housing includes a frame, a first cover, a carrier, a connector further including a body and a plurality of terminals, in addition to a second cover. The first cover is coupled to the frame and has an interior surface that is substantially planer plus an interface surface that is disposed parallel to the interior surface and spaced at an offset dimension that conforms to the type II PCMCIA standard. The carrier, for example a printed circuit board, is arranged to secure and inter couple an electronic circuit and has a first side that is disposed adjacent to the interior surface and a second side that is substantially uniformly spaced from the first side by a thickness dimension.

The body of the connector is disposed adjacent to the interface surface and further includes a plurality of openings extending through the body from a first surface to a second surface where the first surface and the second surface are disposed substantially perpendicular to the interface surface. The plurality of terminals each include a receptacle disposed within a corresponding one of the plurality of openings and an integral contact that extends from the second surface and is formed to be mechanically or physically coupled to the second side of the carrier. The second cover is coupled to the frame and spaced at a height dimension, that conforms to the type II PCMCIA standard, from the first cover and is arranged and constructed for enclosing and protecting the electronic circuit.

In a detailed embodiment the body of the connector further includes a locating arm preferably including a raised element or the like, such as a protuberance, that establishes a physical relationship between the connector and the carrier, more specifically a mating element of the carrier. Further the frame includes an interlocking feature for mechanically coupling the connector to the frame. The interlocking feature is preferably a slot and the body of the connector further includes a tab corresponding to the slot where the tab and the slot are cooperatively arranged so that the connector may be rotatably coupled to the frame. Providing a chamfer on the entry portion of the slot establishes a lead in surface for the tab when the connector is rotatably coupled to the frame. In any event the connector, preferably the body, further includes a mating feature, such as an undercut or plurality of undercuts, for mechanically coupling the first cover and the second cover, or more particularly a plurality of tongues on the covers that corresponds to the undercuts, to the connector. The offset dimension is selected to be substantially equivalent to the thickness dimension to facilitate or enhance internal vertical space, specifically the height dimension subject to the constraints established by the type II PCMCIA standard, for the electronic circuit.

The instant invention can be more fully understood, appreciated, and described with reference to the figures in which FIG. 3 is an overview of a preferred embodiment of a housing in accordance with the instant invention and FIG. 1 is an exploded view, in perspective, demonstrating components of the housing of FIG. 3. FIG. 3 depicts partially assembled, among others and in part, the major elements of an electronics housing or package that is compliant with a type II or extended type II PCMCIA standard. These elements include a frame (101), a first or lower cover (103), a carrier (111), a connector (121), and a second or top cover (137).

As an overview the frame includes a first and a second side rail (150, 152) joined together by one or more cross webs (154). The frame (101) functions to define much of the electronics package outline and many peripheral dimensions, all consistent with the PCMCIA standards, and to provide a structural basis for the balance of the housing. The frame is a molded plastic component, preferably using Polypropyl Sulphone (PPS), glass filled nylon or the like.

The frame (101) includes an interlocking feature (151) that, preferably, takes the form of one or more slots molded into each side rail (150, 152). As further discussed below the slots have a chamfer (153) that provides a lead in surface for rotatably coupling the connector to the frame (101).

The covers, specifically the first or lower and second or upper covers (103, 137) are each, after assembly, substantially disposed in a plane, respectively, on a lower and a upper side of the frame (101) so that the second cover is spaced at a height dimension (239) from the first cover where the height dimension conforms to the PCMCIA standard which is a maximum of 5 millimeters (mm) for the type II PCMCIA standard. The covers (103, 137) are each formed from a blank sheet of metallic material, such as full hard aluminum, stainless steel, or the like and are fashioned to be physically or mechanically coupled to the frame (101) and to each other by means of an interlocking tab (158) arrangement disposed near and along the periphery of the covers and frame. Each of the covers includes a plurality of tongues (157), preferably, formed from the same blank material, extending from an edge of the cover and arranged to mechanically couple to a corresponding mating feature (149), preferably an undercut or depression, on the connector (121). The first cover (103), and similarly and preferably the second cover (137), has an interior surface (105) that is substantially planar and an interface surface (107) that is disposed parallel to and spaced at an offset dimension (209) from the interior surface (105) whereby the offset dimension conforms to the PCMCIA standards.

The connector (121) includes a body (123), preferably, formed from molded plastic and a plurality of terminals (131) each of which is formed from a resilient and conductive material such as Phosphorus Bronze that is tin plated at the contact area and gold plated at the receptacle side. The connector (121) is, preferably, a 68 pin connector where the pins or terminals are arranged in a bottom or first and a top or second row such that all external dimensions and characteristics are compatible with the PCMCIA standard. The body is disposed adjacent to the interface surface (107) when assembled and further includes a first or front surface (125), a second or rear surface (127), and a plurality of openings (129).

The first surface and the second surface of the body are disposed substantially perpendicular to the interface surface and spaced at a depth dimension (241). The plurality of openings extend through the body from the first surface to the second surface. The body further includes a locating arm (141), preferably one proximate to each side rail of the frame (101), that establishes a physical relationship between the carrier (111) and the connector (121). The locating arm further includes a raised element or protuberance (143) that is physically coupled to a mating element (145) on the carrier.

Additionally the body of the connector includes a tab (155), preferably one each proximate to the side rails of the frame corresponding to the interlocking feature (147), specifically the slot (151), that is cooperatively arranged so that the connector may be rotatably mechanically or physically coupled to the frame. Referring to FIG. 3, as the connector (121), as assembled to the carrier (111), is rotated toward the frame (101), the chamfer (153) provides a lead-in surface for the tab (155) as the connector is rotated into position and thus coupled to the frame. Further when the mating features (149) are engaged with the tongues (157) on the second cover (137) and then the rotational movement is induced, the tab (155) and the slot (151) provide a slight interference fit, during rotation, thus snapping into an assembled position that resists modest attempts to disassemble. As depicted in FIG. 1, the tabs (155) include a captive ledge (158) that laterally couples the frame (101) to the connector (121). As assembled, the locating arm(s) (141) are captured between the carrier (111) and an undercut (156) in the cross web (154). Together these inventive features provide an easily assembled housing that once assembled provides a relatively economically advantageous and yet quite rugged package that resists likely forms of abuse and provides protection for electronic circuits that it is intended to house.

The plurality of terminals (131) each include a receptacle (133) that is disposed within the corresponding opening, and an integral contact (135). The integral contacts each extend from the second surface and are formed to be coupled to a second side of the carrier, preferably by a thermal bonding or soldering operation thus providing an electrical and mechanical connection between the receptacle and the carrier. Due to the dimensions and other conditions specified by the PCMCIA standard, adjacent contacts are spaced on a 0.635 mm center to center dimension which necessitates a contact width of 0.3 mm and a space of 0.335 mm. To provide the maximum vertical space (approximately the height dimension (239) less the thickness dimension (217)) for electronic components the carrier is disposed adjacent to the interior surface of the first cover and thus the first surface of the body is approximately 12.5 mm from the point where the contact is coupled to the carrier. From these dimensions and observations it has been experimentally determined that the depth dimension of the body should be 10 mm or more in order to provide sufficient support for the contacts to maintain satisfactory co-planarity between contacts during manufacturing and assembly of the housing.

The carrier (111) is a printed circuit board having a thickness dimension (117), a first side (113), and the second side (115). The thickness dimension including any insulating material has been selected to be substantially equivalent to the offset dimension or 0.85 mm in the preferred embodiment. The carrier is arranged to secure and inter couple an electronic circuit (119), preferably on the second side. The first side (113) of the carrier is disposed adjacent to the interior surface (105) of the first cover. In the preferred embodiment a layer of electrical interconnect is included on the first side (113) and therefore a thin insulating material (not shown), such as glass filled nylon, is disposed between the interior surface and the first side of the carrier.

It will be appreciated by those of ordinary skill in the art that the housing disclosed provides various inventive arrangements for enclosing and protecting electronic components in a PCMCIA compliant package. These inventive arrangements may be readily and advantageously employed in a type II PCMCIA compliant housing to optimize available volume and vertical space for electronic components without otherwise sacrificing manufacturability, quality, or package integrity. Hence, the present invention, in furtherance of satisfying a long-felt need of PCMCIA type housings, and more specifically such housings for a type II application, provides an exemplary arrangement whereby the connector not only provides an electrical interface but is an integral portion of the housing thus eliminating any heretofore need for a further connector or flex circuit to accomplish a similar degree of carrier offset.

It will be apparent to those skilled in the art that the disclosed invention may be modified in numerous ways and may assume many embodiments other than the preferred form specifically set out and described above. For example while one embodiment of the interlocking feature and the locating arm have been described others will be apparent to practitioners in the art. Accordingly, it is intended by the appended claims to cover all modifications of the invention which fall within the true spirit and scope of the invention.

What is claimed is:

1. An electronics housing that is compliant with a type II PCMCIA standard, the housing comprising in combination:
   a frame;
   a first cover, coupled to said frame, having an interior surface that is substantially planar and an interface surface that is disposed parallel to said interior surface and spaced at an offset dimension, said offset dimension conforming to the type II PCMCIA standard;
   a carrier, having a first side and a second side, said first side disposed adjacent to said interior surface and said second side substantially uniformly spaced from said first side by a thickness dimension and arranged to secure and inter couple an electronic circuit;
   a connector further including
      a body disposed adjacent to said interface surface and further including a first surface, a second surface, and a plurality of openings, said first surface and said second surface disposed substantially perpendicular to said interface surface, said plurality of openings extending through said body from said first surface to said second surface, and
      a plurality of terminals each including a receptacle and an integral contact, said receptacle disposed within said opening, said integral contact extending from said second surface and formed to be mechanically coupled to said second side of said carrier;
   a second cover, coupled to said frame and spaced at a height dimension from said first cover, for enclosing and protecting said electronic circuit, said height dimension conforming to the type II PCMCIA standard.

2. The electronics housing of claim 1 wherein said body of said connector further includes a locating arm that establishes a physical relationship between said carrier and said connector.

3. The electronics housing of claim 2 wherein said locating arm further includes a raised element that is physically coupled to a mating element on said carrier.

4. The electronics housing of claim 2 wherein said frame includes an interlocking feature for mechanically coupling said connector to said frame.

5. The electronics housing of claim 4 wherein said connector further includes a mating feature for mechanically coupling said first cover to said connector.

6. The electronics housing of claim 5 wherein said offset dimension is substantially equivalent to said thickness dimension.

7. The electronics housing of claim 1 wherein said frame includes an interlocking feature for mechanically coupling said connector to said frame.

8. The electronics housing of claim 7 wherein said connector further includes a mating feature for mechanically coupling said first cover to said connector.

9. The electronics housing of claim 8 wherein said offset dimension is substantially equivalent to said thickness dimension.

10. The electronics housing of claim 7 wherein said interlocking feature is a slot and said connector further includes a tab that corresponds to said slot, said tab and said slot cooperatively arranged so that said connector may be rotatably coupled to said frame.

11. The electronics housing of claim 10 wherein said slot further includes a chamfer that provides a lead in surface for said tab when said connector is rotatably coupled to said frame.

12. The electronics housing of claim 1 wherein said connector further includes a mating feature for mechanically coupling said first cover to said connector.

13. The electronics housing of claim 12 wherein said offset dimension is substantially equivalent to said thickness dimension.

* * * * *